United States Patent [19]

Kojima et al.

[11] Patent Number: 5,275,915
[45] Date of Patent: Jan. 4, 1994

[54] DEVELOPER FOR LIGHT-SENSITIVE MATERIAL

[75] Inventors: Yasuhiko Kojima; Yasuo Shigemitsu, both of Saitama, Japan

[73] Assignee: Dainippon Ink and Chemicals, Inc., Tokyo, Japan

[21] Appl. No.: 892,148

[22] Filed: Jun. 2, 1992

[30] Foreign Application Priority Data

Jun. 5, 1991 [JP] Japan .................. 3-134166

[51] Int. Cl.$^5$ .............................. G03C 1/06
[52] U.S. Cl. .................... 430/264; 430/268; 430/405; 430/489; 430/487; 430/493; 430/449; 430/434; 430/464; 430/435
[58] Field of Search ........... 430/264, 268, 405, 489, 430/487, 493, 449, 434, 464, 435

[56] References Cited

U.S. PATENT DOCUMENTS

| | | | |
|---|---|---|---|
| 4,957,849 | 9/1990 | Inoue et al. | 430/264 |
| 5,106,724 | 4/1992 | Nogami et al. | 430/331 |
| 5,141,843 | 8/1992 | Ooms et al. | 430/268 |

FOREIGN PATENT DOCUMENTS

| | | |
|---|---|---|
| 0279630 | 8/1988 | European Pat. Off. . |
| 0405986 | 1/1991 | European Pat. Off. . |
| 2454879 | 5/1976 | Fed. Rep. of Germany . |
| 0279245 | 11/1989 | Japan . |

OTHER PUBLICATIONS

Patent Abstracts of Japan vol. 13, No. 433 (P-941) (3791) 5 Oct. 1989 & JP-a-1 170 941 (Konica Corporation) 6 Jul. 1989 *abstract*.
Patent Abstracts of Japan vol. 14, No. 50 (P-998) (3993) 30 Jan. 1990 & JP-A-1 279 245 (Dainippon Ink & Chem. Inc.) 9 Nov. 1989 *abstract*.
T. H. James, The Theory of the Photographic Process, Fourth Edition, Macmillan, 1977, 396-397.

*Primary Examiner*—Charles L. Bowers, Jr.
*Assistant Examiner*—Thomas R. Neville
*Attorney, Agent, or Firm*—Armstrong, Westerman, Hattori, McLeland & Naughton

[57] ABSTRACT

A developer for light-sensitive material capable of processing in common a negative-working light-sensitive lithographic printing plate and a positive-working light-sensitive printing plate as well as a developing agent-containing type silver halide photographic material, is disclosed. The developer comprises an alkali agent, an anionic surface active agent, an antifoggant for a silver halide photographic material, and an alkylene oxide addition product (molecular weight of from 130 to 1200) of an aromatic amine or an aralkyl amine, and has pH of the range of from 11.5 to 13.5.

9 Claims, No Drawings

DEVELOPER FOR LIGHT-SENSITIVE MATERIAL

FIELD OF THE INVENTION

The present invention relates to a developer for light-sensitive materials capable of developing well with a developer having a same composition negative-working and positive-working light-sensitive lithographic printing plates useful for making printing plates and also developing agent-containing silver halide photographic light-sensitive materials forming negative images useful for a printing photomechanical process, in a graphic art.

BACKGROUND OF THE INVENTION

Hitherto, the composition of a developer for developing a negative-working lithographic light-sensitive printing plate differs from the composition of a developer for developing a positive-working light-sensitive lithographic printing plate, and each light-sensitive lithographic printing plate can be suitably developed with each specific developer only.

If each light-sensitive lithographic printing plate could be developed using a developer which is not the specific developer for the light-sensitive lithographic printing plate, a lithographic printing plate having a sufficient performance is not obtained and thus it was substantially impossible to develop well in common a negative-working light-sensitive lithographic printing plate and a positive-working light-sensitive lithographic printing plate with a developer having a same composition.

However, recently, photosensitive resins being used for negative-working and positive-working light-sensitive lithographic printing plates and a developer therefor are improved and a developer which can develop well both the negative-working light-sensitive lithographic printing plate and the positive-working light-sensitive lithographic printing plate with a same composition has been developed as shown below.

That is, examples of the developer which can develop well both negative-working and positive-working light-sensitive lithographic printing plates with a same composition are disclosed, e.g., in JP-A-60-130741, JP-A-237442, JP-A-62-187855, JP-A-63-200154, JP-A-1-270050, JP-A-1-282549, JP-A-157846 (the term "JP-A" as used herein means an "unexamined published Japanese patent application"), U.S. Pat. Nos. 3,913,183 and 3,913,141 and European Patent 279,630.

However, the developers illustrated in the above publications can not always develop in common all sorts of negative-working and positive-working light-sensitive lithographic printing plates and the processing effect of the developers is largely influenced by the characteristics of the negative-working and positive-working light-sensitive lithographic printing plates being processed. In other words, the various characters such as the composition ratios and the polymerization degrees of the binder resins and photosensitive resins (e.g., o-quinoneazido compounds and diazo resins) which are constituting compositions for each of a negative-working light-sensitive lithographic printing plate and a positive-working light-sensitive lithographic printing plate are well-balanced such that both the light-sensitive lithographic printing plates are developed well with a same developer. Hence light-sensitive materials being processed with a developer are restricted.

The developer which can be used for both a negative-working light-sensitive lithographic printing plate and a positive-working light-sensitive lithographic printing plate is an alkaline aqueous solution and thus it is considered that the developer can be used as an activator for a developing agent-containing type silver halide photographic material. In fact, images of a developing agent-containing silver halide photographic material are obtained only in the case of using a developer having pH of at least 13 for developing a positive-working light-sensitive lithographic printing plate or using a developer having high pH for both of negative and positive light-sensitive lithographic printing plates. Moreover, the images obtained are negative images having a very soft tone (low contrast) and such images can not be practically used as plate-making photographic images. As described above, the conventional developers which are used for developing both a negative-working light-sensitive lithographic printing plate and a positive-working light-sensitive lithographic printing plate can not be used as a good activator for a developing agent-containing type silver halide photographic material.

On the other hand, examples of an activator which can provide good negative images by processing a developing agent-containing type silver halide photographic material are disclosed, e.g., in JP-B-56-30848, JP-B-60-12624, JP-B-15264, JP-B-15265, JP-B-60-47578, JP-B-61-48696, JP-B-62-4700, JP-B-62-12498, JP-B-62-12499, JP-B-1-17140 (the term "JP-B" as used herein means an "examined Japanese patent publication"), U.S. Pat. Nos. 4,330,617, 4,385,108, 4,429,036, and 4,447,522.

The activators being used in the foregoing examples are alkaline aqueous solutions having various compositions and in the case of processing developing agent-containing type silver halide photographic materials using these activators, good negative images are obtained. However, in the case of developing a negative-working light-sensitive lithographic light-sensitive plate or a positive-working light-sensitive lithographic printing plate with each of the foregoing activators, an aluminum plate which is the base plate thereof is corroded or the development is inferior, whereby a good printing plate can not be obtained.

As described above, hitherto, the developer which can develop a negative-working light-sensitive lithographic printing plate and/or a positive-working light-sensitive lithographic printing plate can not develop a developing agent-containing type silver halide photographic material and also the activator for developing a developing agent-containing type silver halide photographic material can not develop a negative-working light-sensitive lithographic printing plate and/or a positive-working light-sensitive lithographic printing plate.

However, we previously found a developer capable of solving the foregoing problem, that is, capable of developing well a negative-working light-sensitive lithographic printing plate and a positive-working light-sensitive lithographic printing plate and further a developing agent-containing type silver halide photographic material and have filed as Japanese Patent Application No. 2-306680.

By using the developer, the foregoing three kinds of the light-sensitive materials can be developed well but the use of the foregoing developer is accompanied by the following problems. That is, since alkanolamine is used, a nasty smell is strong which causes a trouble for handling the developer, since a large amount of alkanolamine is required during processing, there is an economical problem, since the negative images obtained have a sufficient quality as line works but have a considerably insufficient quality as dot works, and since the printing impression of the printing plates obtained by the development is as low as about 30,000 prints.

Also, JP-A-1-279245 discloses that a negative-working light-sensitive lithographic printing plate is developed well using a developer containing a compound shown by the following formula (II):

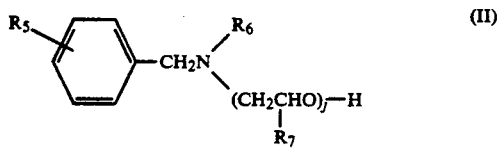

wherein $R_5$ represents a hydrogen atom, a halogen atom, an alkyl group, or an alkoxy group; $R_6$ represents a hydrogen atom, an alkyl group, or —(CH$_2$CR$_7$HO)$_k$—H; $R_7$ represents a hydrogen atom or an alkyl group having 1 or 2 carbon atoms; and j and k each represents an integer of from 1 to 3.

However, in the case of developing a developing agent-containing type silver halide photographic material using the developer, the formation of fog is severe and the contrast is low, thereby good results can not be obtained.

SUMMARY OF THE INVENTION

An object of the present invention is to provide a developer for light-sensitive materials capable of being used in common for a printing photomechanical process and plate-making processes by processing negative-working and positive-working light-sensitive lithographic printing plates as pre-step for printing with a same composition of the developer.

Other object of the present invention is to provide a developer for light-sensitive materials, which can solve the problems of simplicity, economy, generation of bad smell, etc., at the preparation of the developer and also solve the themes of improving negative images having a sufficient quality and sufficiently high contrast as dot works and improving the printing impression of negative-working and positive-working light-sensitive lithographic printing plates.

Thus, according to the present invention, there is provided a developer for light-sensitive materials capable of processing in common a negative-working light-sensitive lithographic printing plate and a positive-working light-sensitive printing plate as well as a developing agent-containing type silver halide photographic material, wherein said developer comprises an alkali agent, an anionic surface active agent, an antifoggant for a silver halide photographic material, and an alkylene oxide addition product (molecular weight of from 130 to 1200) of an aromatic amine or an aralkyl amine, and has pH of the range of from 11.5 to 13.5.

In a preferred embodiment of the present invention, the foregoing alkylene oxide addition product of an aromatic amine or an aralkyl amine is an amino compound represented by the following formula (I):

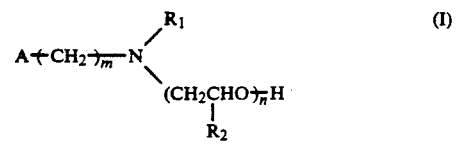

wherein A represents an aromatic group which may be substituted; $R_1$ represents a hydrogen atom, an alkyl group, or

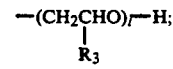

$R_2$ and $R_3$ each represents a hydrogen atom or a methyl group; m represents 0 or an integer of from 1 to 4; and l and n each represents an integer of from 1 to 4.

According to a further embodiment of the present invention, there is also provided a developing process of light-sensitive materials using the foregoing developer.

DETAILED DESCRIPTION OF THE INVENTION

Then, the components for the developer of the present invention are described in detail.

In formula (I), specific examples of the aromatic group represented by A include a phenyl group and a naphthalene group. These groups may be substituted by a halogen atom (e.g., iodine, bromine, chlorine), an alkyl group (e.g., methyl, ethyl, propyl, iso-propyl, butyl, iso-butyl, t-butyl), a dialkylamino group (e.g., dimethylamino, diethylamino, dipropylamino, methylethylamino), or an alkoxy group (e.g., methoxy, ethoxy), etc. Specific examples of the alkyl group represented by R include a methyl group, an ethyl group, a propyl group, an iso-propyl group, a butyl group, an iso-butyl group, and a t-butyl group.

More preferably, the alkylene oxide addition product of an aromatic amine or an aralkyl amine of the present invention is an amino compound represented by the following formula (I'):

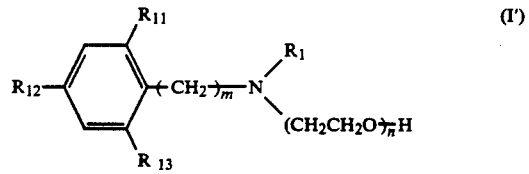

wherein $R_{11}$, $R_{12}$ and $R_{13}$ each represents a hydrogen atom, a halogen atom, an alkyl group, a dialkylamino group, or an alkoxy group; R represents a hydrogen atom, an alkyl group, or —(CH$_2$CH$_2$O)$_l$—H; m represents 0 or an integer of from 1 to 4; and l and n each represents an integer of from 1 to 4.

In formula (I'), $R_{11}$, $R_{12}$ and $R_{13}$ specifically represent a halogen atom (e.g., iodine, bromine, chlorine), an alkyl group (e.g., methyl, ethyl, propyl, iso-propyl, butyl, iso-butyl, t-butyl), a dialkylamino group (e.g., dimethylamino, diethylamino, dipropylamino, diisopropylamino, methylethylamino, methylpropylamino, methylisopropylamino, ethylpropylamino, ethylisopropylamino), or an alkoxy group (e.g., methoxy, ethoxy). Specific examples of the alkyl group represented by $R_1$ include a methyl group, an ethyl group, a propyl group, an iso-propyl group, a butyl group, an iso-butyl group, and a t-butyl group.

As the alkylene oxide addition product of an aromatic amine or an aralkyl amine being used in the present invention, an ethylene oxide or propylene oxide addition product of phenyl amine or benzyl amine is particularly preferably used.

Specific examples of the amino compound shown by formula (I) are illustrated below although the invention is not limited to these compounds.

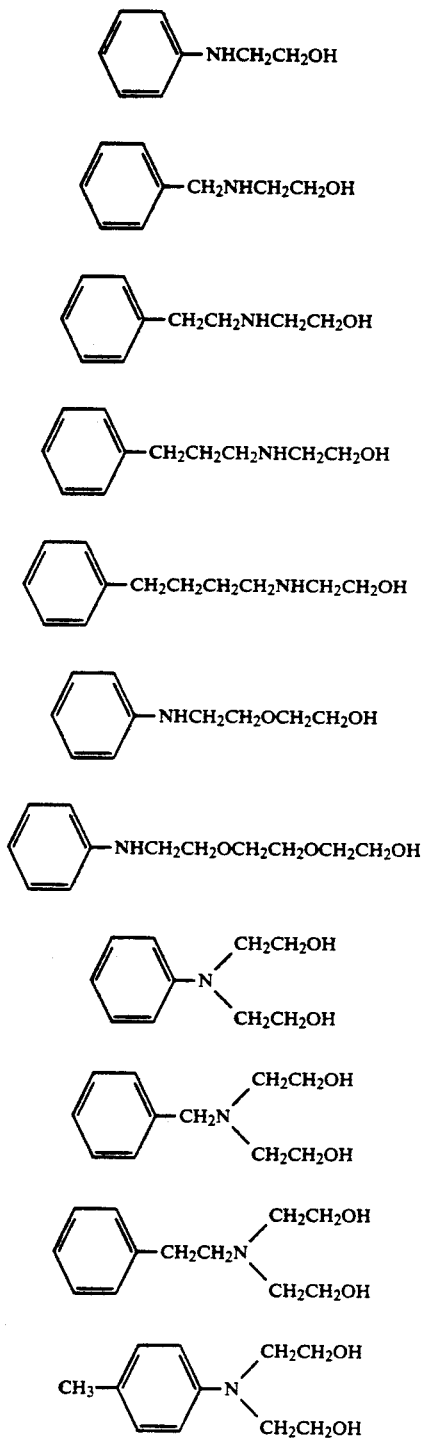

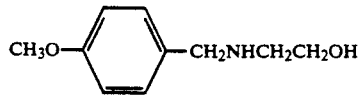

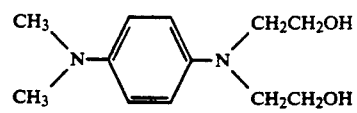

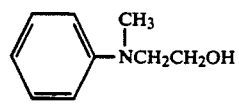

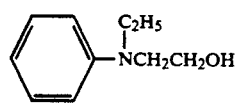

The compounds shown by formula (I) being used in the present invention can be used singly or as a mixture thereof.

The alkylene oxide addition product is preferably contained in the developer in the range of 15% by weight or less.

As the alkali agent being used in the present invention, inorganic alkali agents such as sodium silicate, potassium silicate, sodium metasilicate, sodium hydroxide, potassium hydroxide, lithium hydroxide, sodium phosphate, sodium dihydrogen phosphate, ammonium phosphate, ammonium dihydrogen phosphate, sodium hydrogen-carbonate, sodium borate, ammonium borate, ammonia, etc., are preferably used and they can be used singly or as a combination thereof. Also, as the alkali agent, organic alkali agents such as organic amine compounds can be used but organic alkali agents having a strong bad smell are practically undesirable.

At the preparation of the developer of the present invention, a method wherein an alkali silicate is used as the main alkali agent and for the fine control of pH, etc., thereafter, other alkali agent is preferably used. The content of the alkali agent in the developer is from 0.05 to 10% by weight necessary for keeping pH of the developer in the range of from 11.5 to 13.5.

Examples of the anionic surface active agent being used in the present invention are sulfuric acid ester salts of higher alcohols having from 8 to 22 carbon atoms such as a sodium salt of lauryl alcohol sulfate, a sodium salt of octyl alcohol sulfate, an ammonium salt of lauryl alcohol sulfate, etc.; aliphatic alcohol phosphoric acid ester salts such as a sodium salt of a cetyl alcohol phosphoric acid ester, etc.; alkylaryl sulfonates such as a sodium salt of dodecylbenzenesulfonic acid, a sodium salt of isopropylnaphthalenesulfonic acid, a sodium salt of 3-nitrobenzenesulfonic acid, etc.; sodium salts of N-acyltaurine such as a sodium salt of N-methyl-N-lauroyl taurine, etc.; and sulfonates of a dibasic fatty acid ester, such as a sodium sulfosuccinic acid dioctyl ester, a sodium sulfosuccinic acid dihexyl ester, etc.

The anionic surface active agent is suitably contained in the developer in the range of from 1 to 10% by weight.

As the antifoggant for silver halide photographic materials being used in the present invention, the organic compounds containing a sulfur atom or a nitrogen atom described in T. H. James, *The Theory of the Photo-*

*graphic Process*, 4th edition, page 396, published by Macmillan Co., 1977; Akira Sasai, *Shashin no Kagaku (Chemistry of Photography)*, 2nd edition, page 168, published by Shashin Kogyo Shuppan Sha, 1987; *Shashin Kogaku no Kiso (The Basis of Photographic Engineering)*, "Gin-en Shashin Hen (Volume of Silver Halide Photography)", edited by Nippon Shashin Gakkai, the 1st edition, published by Corona Publishing Co., Ltd., 1980, etc., are suitably used.

Specific examples of the organic compound containing a sulfur atom or a nitrogen atom being used in the present invention are nitrobenzimidazoles described in U.S. Pat. Nos. 2,496,940 and 2,656,271; mercaptobenzoimidazole, 5-methylbenzotriazole, 1-phenyl-5-mercaptotetrazole; the compounds for rapid access processing liquids described in U.S. Pat. Nos. 3,113,864, 3,342,596, 3,295,976, 3,615,522, 3,597,199, etc.; the thiosulfonyl compounds described in British Patent 972,211; the phenazine-N-oxides described in JP-B-46-41675, and the antifoggants described in *Kagaku Shashin Binran (Handbook of Scientific Photography)*, the 2nd Vol., pages 29-47, published by Maruzen K. K. These antifoggants can be used singly or as a combination thereof.

The amount of the antifoggant being used in the present invention is selected in the range that the development of a negative-working light-sensitive lithographic printing plate and a positive-working light-sensitive lithographic printing plate is not influenced by the addition of the antifoggant and the range that in the development of a developing agent-containing type silver halide photographic material, good negative images having a sufficiently high contrast are obtained.

Practically, the antifoggant is used in the range of from 1 mg/liter to 1 g/liter, and preferably from 5 mg/liter to 500 mg/liter to the developer.

The pH of the developer of the present invention is in the range of from 11.5 to 13.5. When the developer beyond the pH range described above is used in common for a negative-working light-sensitive lithographic printing plate, a positive-working light-sensitive lithographic printing plate, and a developing agent-containing type silver halide photographic material, satisfactory results can not be obtained. That is, if pH of the developer is lower than 11.5, the development of a positive-working light-sensitive lithographic printing plate is liable to become insufficient and at the same time the development of a developing agent-containing type silver halide photographic material is under developed, whereby clear negative images are not obtained. On the other hand, if pH of the developer is over 13.5, the image obtained with a negative-working light-sensitive lithographic printing plate is inferior and also the development of a positive-working light-sensitive lithographic printing plate becomes excessive, lacking of fine portions of images and the corrosion of the grained surface of the plate are liable to occur. Moreover, the development of a developing agent-containing type silver halide photographic material is subjected to bad influences such as the increase of fog, etc.

Also, the developer of the present invention can further contain various additives which are known in the field of the art for improving the development performance. Examples of such additives are sodium sulfite and a sodium salt of sulfopyrazolone as a stain inhibitor, ethylenediaminetetraacetic acid tetra-sodium salt and nitrilotriacetic acid tri-sodium salt as a hard water softener, and, if necessary, a defoaming agent, a wetting agent and an oleophilic property improving agent.

Then, typical examples of the photosensitive composition contained in the photosetting light-sensitive layer of a negative-working light-sensitive lithographic printing plate to which the developer of the present invention can be applied are as follows.

(1) Photosensitive composition composed of a photosensitive diazo resin and a binder resin:

As a photosensitive diazo resin, there are diazo resins such as, typically, a condensation product of a diazodiarylamine and an active carbonyl compound and the diazo resin which is insoluble in water but soluble in an organic solvent is preferred.

Particularly suitable diazo resins are the organic acid salts of the inorganic acid salts of the condensation products of 4-diazodiphenylamine, 4-diazo-3-methyldiphenylamine, 4-diazo-4'-methyldiphenylamine, 4-diazo-3'-methyldiphenylamine, 4-diazo-3-methyl-4'-ethoxydiphenylamine, 4-diazo-3-methoxydiphenylamine, etc., a formaldehyde, paraformaldehyde, acetaldehyde, benzaldehyde, 4,4'-bis(methoxymethyl)diphenyl ether, etc.

As the organic acid salt, there are, for example, the salts of methanesulfonic acid, benzenesulfonic acid, toluenesulfonic acid, xylenesulfonic acid, mesitylenesulfonic acid, dodecylbenzenesulfonic acid, naphthalenesulfonic acid, propylnaphthalenesulfonic acid, 1-naphthol-5-sulfonic acid, 2-nitrobenzenesulfonic acid, 3-chlorobenzenesulfonic acid, 2-hydroxy-4-methoxybenzophenone-5-sulfonic acid, 2,4-dihydroxybenzophenone, benzenephosphinic acid, etc., and as the inorganic acid salt, there are the salts of hexafluorophosphoric acid, tetrafluoroboric acid, etc.

As other photosensitive diazo resins, the diazo resins having a polyester group at the main chain described in JP-A-54-30121, U.S. Pat. Nos. 4,215,041 and 4,284,705; diazo resins obtained by reacting a polymer having a carboxylic anhydride residue and a diazo compound having a hydroxy group described in JP-A-61-273538; and diazo resins obtained by reacting a polyisocyanate compound and a diazo compound having a hydroxy group can be used.

As the binder resin, there are, for example, a (meth)acrylic acid ester copolymer [hereinafter, acrylic acid and methacrylic acid are called as (meth)acrylic acid], the copolymers containing a hydroxyalkyl (meth)acrylate and (meth)acrylonitrile having an acid value of from 10 to 100 described in U.S. Pat. No. 4,123,276; the copolymers having an aromatic hydroxy group described in JP-B-57-43890 and U.S. Pat. No. 4,282,301; the copolymers having a 2-hydroxy-3-phenoxypropyl (meth)acrylate unit described in JP-B-57-51656; an epoxy resin; a polyamide resin; halogenated vinyl polymers such as polyvinyl chloride and polyvinylidene chloride; polyvinyl acetate; polyester; acetal resins such as a formal resin, a butyral resin, etc.; a soluble polyurethane resin commercially available as a trade name of Estane, made by Goodrich Co.; polystyrene; a styrene-maleic anhydride copolymer or a half ester thereof; cellulose derivatives; shellac; and rosin or the denatured product thereof.

(2) Photosensitive composition containing a photo-crosslinking type resin:

As the photo-crosslinking resin, a photo-crosslinking resin having an affinity for an aqueous alkaline developer is preferable and examples thereof are the copolymer having a cinnamic acid group and a carboxy group described in JP-B-54-15711; the polyester resin having a phenylenediacrylic acid residue and a carboxy group described in JP-A-60-165646; the polyester resin having a phenylenediacrylic acid residue and a phenolic hydroxy group described in JP-A-60-203630; the polyester resin having a phenylenediacrylic acid residue and a sodium iminodisulfonyl group described in JP-B-57-42858 and U.S. Pat. No. 3,929,489; and the polymer having an azido group and a carboxy group at the side chain thereof described in JP-A-59-208552 and U.S. Pat. No. 4,588,669

(3) Photosensitive composition containing an addition polymerizable unsaturated compound and a photopolymerization initiator:

As the photosensitive composition, there are compositions composed of an addition polymerizable unsaturated compound having 2 or more terminal ethylene groups and a photopolymerization initiator described in U.S. Pat. Nos. 2,760,863 and 3,060,023 and JP-A-62-121448. Furthermore, as the binder resin, the binder resins described in foregoing (1) and the copolymer having an unsaturated group at the side chain described in JP-A-61-285449 can be used.

To the foregoing photosensitive composition are further added, if necessary, a dye, a pigment, a stabilizer, a filler, a crosslinking agent, etc., and after dissolving the photosensitive composition in a suitable solvent, the solution obtained is coated on a support followed by drying to provide a negative-working light-sensitive lithographic printing plate having a photosensitive layer of usually from 0.5 to 5 g/m$^2$.

Typical examples of the photosensitive component for the photosensitive layer of a positive-working light-sensitive lithographic printing plate to which the developer of the present invention can be applied include o-quinonediazide compounds, acid-decomposable ether compounds and ester compounds.

Specific examples of the o-quinonediazide compound are described in JP-A-47-5303, JP-A-48-63802, JP-A-48-63-803, JP-A-49-38701, JP-A-56-1044, JP-A-56-1045, JP-B-41-1222, JP-B-43-28403, JP-B-45-9610, JP-B-49-17481, U.S. Pat. Nos. 2,797,213, 3,046,120, 3,188,210, 3,454,400, 3,544,323, 3,573,917, 3,674,495, and 3,785,825, British Patents 1,227,602, 1,251,345, 1,267,005, 1,329,888, and 1,330,932, German Patent 854,890, etc.

Also, examples of the acid-decomposable compound are described in JP-A-60-37549, JP-A-60-10247, JP-A-60-3625, U.S. Pat. Nos. 4,752,552 and 4,816,375.

These compounds can be used singly or as a combination thereof as the photosensitive component of light-sensitive materials to which the developer of the present invention can be preferably applied.

These photosensitive components include o-quinonediazidocarboxylic acid esters of aromatic hydroxy compounds and o-quinonediazidosulfonic acid amides or o-quinonediazidocarboxylic acid amides of aromatic amino compounds. Also, these o-quinonediazido compounds may be used singly or as a mixture thereof and an alkali-soluble resin for the photosensitive layer of a positive-working light-sensitive lithographic printing plate.

The foregoing alkali-soluble resin includes novolak type phenol resins such as, practically, a phenolformaldehyde resin, a cresol-formaldehyde resin, a phenol-cresol mixed formaldehyde resin, a cresol-xylenol mixed formaldehyde resin, etc. Furthermore, as described in JP-A-50-125806 and U.S. Pat. No. 4,123,279, a mixture of the foregoing phenol resin and a condensation product of phenol or cresol substituted by an alkyl group having from 3 to 8 carbon atoms and formaldehyde, such as t-butylphenolformaldehyde resin can be applied as the alkali-soluble resin.

The photosensitive layer using the o-quinonediazido compound as the photosensitive component can further contain, if necessary, additives such as a dye, a plasticizer, a component imparting a printout performance, etc.

The amount of the o-quinonediazido compound as a photosensitive component for the photosensitive layer per unit area is preferably in the range of from 0.5 to 7 g/m$^2$.

As the supports for the foregoing negative-working and positive-working light-sensitive lithographic printing plates, there are, for example, metal plates such as the plates of aluminum, zinc, copper, stainless steel, iron, etc.; plastic films such as the films of polyethylene terephthalate, polycarbonate, polyvinyl acetal, polyethylene, etc.; and a composite material obtained by forming a metal layer on a paper coated with a molten synthetic resin or a synthetic resin solution or on a plastic film by a technique such as a vacuum vapor deposition or a lamination.

The development for the negative-working or positive-working light-sensitive lithographic printing plate with the developer of the present invention can be carried out by an ordinary operation. For example, in the case of developing the negative-working light-sensitive lithographic printing plate, the photosensitive layer thereof is image-exposed with a negative image in a state of contact therewith to harden and insolubilize the exposed portions of the photosensitive layer and thereafter the unexposed portions are dissolved off by developing with the developer of the present invention to form the corresponding image on the support. On the other hand, in the case of the positive-working light-sensitive lithographic printing plate, the photosensitive layer is image-exposed with a positive image in a state of contact therewith to decompose and solubilize the exposed portions of the photosensitive layer and thereafter, the exposed portions are dissolved off by developing with the developer of the present invention to form a desired image on the support. After development, a treatment by water washing and/or by an aqueous desensitizing agent solution is applied.

As the aqueous desensitizing agent solution, there are, for example, aqueous solutions of a water-soluble natural high polymer such as gum arabic, dextrin, carboxymethyl cellulose, etc., and a water-soluble synthetic high polymer such as polyvinyl alcohol, polyvinyl pyrrolidone, polyacrylic acid, etc. If necessary, the aqueous desensitizing agent may further contain an acid, a surface active agent, etc.

Then, a developing agent-containing type silver halide photographic material to which the developer of this invention can be applied is explained.

The term "developing agent-containing type silver halide photographic material" in this invention means a substantially surface latent image-type silver halide photographic material having at least one silver halide emulsion layer, wherein at least one of said silver halide emulsion layer or other hydrophilic colloid layer(s) contains a developing agent or a precursor for the developing agent.

It is known that a developing agent or the precursor thereof is incorporated in a silver halide photographic material having at least one silver halide emulsion layer as disclosed, e.g., in JP-B-47-28330, JP-B-47-33379, JP-B-56-30848, JP-B-60-12624, JP-B-15265, JP-B-60-47575, JP-B-60-47578, JP-B-61-38457, JP-B-61-38461, JP-B-61-38462, JP-B-61-48696, JP-B-62-4700, JP-B-62-4701, JP-B-62-4704, JP-B-62-12498, JP-B-62-12499, U.S. Pat. Nos. 3,847,618, 4,330,617, 4,385,108, 4,429,036, and 4,447,522.

As the developing agent or the precursor thereof being contained in the foregoing silver halide photographic material, there are, for example, polyhydroxybenzenes such as hydroquinone, catechol, etc., and the precursors derived from them; and aminophenol compounds such as N-methyl-p-aminophenol, etc., and the precursors derived from them. They can be used singly or as a combination thereof.

For incorporating the foregoing developing agent or the precursor thereof in the silver halide photographic material, a conventionally known method can be used. For example, the developing agent or the precursor thereof is dissolved in an organic solvent miscible with water, such as alcohols, glycols, ketones, esters, amides, etc., which do not give bad influences on the photographic characteristics to form a solution thereof and after adding the solution to a silver halide emulsion or other coating composition for forming other hydrophilic colloid layer, the mixture is coated. Also, as described in JP-A-50-39928, an oil dispersion of the developing agent or the precursor thereof may be added to the silver halide emulsion or other coating composition. Also, the developing agent or the precursor thereof is uniformly dissolved in an aqueous gelatin solution, and after adding the solution to the silver halide emulsion or other coating composition, the mixture may be coated. Furthermore, as described in JP-B-45-15461, the developing agent or the precursor thereof is dispersed in a polymer such as alkyl acrylates, alkyl methacrylates, cellulose esters, etc., and after adding the dispersion to the silver halide emulsion or other coating composition, the mixture can be coated.

As the hydrophilic colloid layer in which the developing agent or the precursor thereof is contained, there is at least one hydrophilic colloid layer constituting the silver halide photographic material, such as a silver halide emulsion layer, a protective layer, an interlayer, an antihalation layer, a filter layer, a subbing layer, a backing layer, etc., and further the developing agent or the precursor thereof may be incorporated in two or more hydrophilic colloid layers.

The amount of the developing agent or the precursor thereof incorporated in the silver halide photographic material is from 0.1 to 5 mols, and preferably from 0.2 to 3 mols per mol of silver halide.

The developing agent-containing type silver halide photographic material to which the developer of the present invention is applied has at least one emulsion layer composed of a substantially surface latent image type silver halide emulsion. The substantially surface latent image type silver halide emulsion means a silver halide emulsion of a type that a latent image is formed mainly on the surface of silver halide grains and has a property against an internal latent image type silver halide emulsion.

There is no particular restriction on the halogen composition of the silver halide emulsion being used, and the composition may be silver chloride, silver chlorobromide, silver iodobromide, silver iodobromochloride. The content of silver iodide is preferably not more than 5 mol %, and more preferably not more than 3 mol %.

The silver halide grains may have a relatively broad grain size distribution but have preferably a narrow grain size distribution, and a monodisperse silver halide emulsion wherein the grain sizes of 90% of the total silver halide grains are within $\pm 40\%$ of the mean grain size is particularly preferred.

The mean grain size of the silver halide grains is preferably not larger than 0.7 $\mu$m, and more preferably not larger than 0.4 $\mu$m. Also, the silver halide grains may have a regular crystal form such as cubic, octahedral, etc., or may have an irregular crystal form such as spherical, tabular, etc.

The silver halide grains can be prepared by any known method. That is, an acidic method, a neutral method, an ammoniacal method, etc., may be used and as a mixing process of a soluble silver salt and a soluble halide, a single jet method, a reverse mixing method, a double jet method, or a combination thereof may be used. When as one of double jet methods, a so-called pAg controlled double jet method, that is a method of keeping a constant silver ion concentration (pAg) in a liquid phase of forming silver halide grains is used, monodispersed silver halide grains having a uniform crystal form and almost uniform grain sizes are obtained. In the step of forming or physical ripening silver halide grains, a cadmium salt, an iridium salt, or a rhodium salt may exist in the system for increasing the contrast of the silver halide emulsion obtained.

The content of the binder contained in the silver halide photographic emulsion layer is preferably not over 250 g per mol of the silver halide contained therein. As the binder, gelatin is most preferably used but other hydrophilic colloids than gelatin can be used. For example, albumin, casein, a graft polymer of gelatin and other polymer, and hydrophilic polymers such as polyvinyl alcohol, polyacrylamide, etc., can be used.

The silver halide emulsion may not be chemically sensitized but is usually chemically sensitized. As a chemical sensitization method, a sulfur sensitization method, a reduction sensitization method, a noble metal sensitization method, or a combination thereof is used but the particularly preferred chemical sensitization method in this invention is a sulfur sensitization method or a method of a combination of a sulfur sensitization and a gold sensitization which is one of noble metal sensitizations.

For the sulfur sensitization, active gelatin, thiosulfates, thioureas, allylthiocarbamide, etc., can be used. Also, for the gold sensitization, $HAuCl_4$, $Au(SCN)_2^-$ salt, $Au(S_2O_3)_2^{3-}$ salt, etc., can be used.

The silver halide emulsion is spectrally sensitized using one or more kinds of sensitizing dyes for imparting a spectral sensitivity to a desired wavelength region. As the sensitizing dyes, cyanine dyes, merocyanine dyes, styryl dyes, hemicyanine dyes, holopolar cyanine dyes, oxonol dyes, hemioxonol dyes, etc., can be used. Particularly useful dyes are cyanine dyes and merocyanine dyes. Any conventionally utilized nucleus as basic heterocyclic nucleus is applicable to the dyes. That is, a pyrroline nucleus, an oxazole nucleus, an oxazoline nucleus, a thiazole nucleus, a thiazoline nucleus, a pyrrole nucleus, a solenazole nucleus, an imidazole nucleus, a tetrazole nucleus, a pyridine nucleus, an indole nucleus, a benzoxazole nucleus, a benzothiazole nucleus, a benzoselenazole nucleus, a benzimidazole nucleus, a quinoline nucleus, etc., can be applied.

The developing agent-containing type silver halide photographic material to which the developer of the present invention is applied has at least one hydrophilic colloid layer containing a substantially surface latent image type silver halide emulsion coated on a support and may have one or more light-insensitive hydrophilic colloid layers such as a protective layer, an interlayer, an antihalation layer, a filter layer, a subbing layer, etc. These hydrophilic colloid layers may contain an inorganic or organic hardening agent.

As the hardening agent, chromium salts (chromium alum, etc.), aldehydes (formaldehyde, glyoxal, etc.), N-methylol compounds (dimethylol urea, methylol dimethylhydantoin, etc.), active halogen compounds (2,4-dichloro-6-hydroxy-s-triazine, mucochloric acid, etc.), active vinyl compounds (1,3,5-triacryloyl-hexahydro-s-triazine, etc.), epoxy series hardening agents, aziridine series hardening agents, etc., can be used.

The foregoing hydrophilic colloid layers may further contain, if necessary, various photographic additives such as emulsion stabilizers (hydroxytetraazaindene compounds such as 6-hydroxy-4-methyl-1,3,3a,7-tetraazaindene, etc.), spreading agents (saponin, etc.), gelatin plasticizers (copolymer of acrylic acid ester, etc.), antistatic agents, coating aids, various surface active agents (cationic, anionic, nonionic, and amphoteric surface active agents) for improving photographic characteristics (development acceleration, contrast increasing, etc.), antifoggants (hydroquinone, 5-methylbenzotriazole, 1-phenyl-5-mercaptotetrazole, etc.), matting agents, water-insoluble or sparingly water-soluble polymer latexes (homopolymers or copolymers of alkyl acrylate, alkyl methacrylate, acrylic acid, glycidyl acrylate, etc.) for improving the dimensional stability of the silver halide photographic material, etc, as long as the effects of the present invention are not reduced.

As the support being used for the foregoing silver halide photographic material, polyolefin films such as polyethylene films, polypropylene films, polystyrene films, etc., cellulose ester films such as cellulose acetate films, cellulose nitrate films, etc., polyester films such as polyethylene terephthalate films, etc., papers, synthetic papers, composite sheets of them, e.g., a paper one surface or both surfaces of which are coated with a polyolefin, etc., can be used.

For forming photographic images by developing the developing agent-containing type silver halide photographic material using the developer of this invention, a method same as a development processing method of a developing agent-containing type silver halide photographic material using an ordinary activator can be applied. For example, after image-exposing the developing agent-containing type silver halide photographic material, the photographic material is immersed in the developer to form images and in this case, it is preferable to stir the developer. For stirring the developer, various known methods (e.g., a means of rotating stirring blades and a means of blowing an inert gas into the developer) can be used.

An ordinary development temperature is in the range of 18° C. to 50° C. but other temperatures than above may be employed.

After development, fixing, washing, and drying are carried out according to a known ordinary method, whereby a desired good negative image can be obtained. In addition to the foregoing development process and post processes, a process by known auxiliary baths (e.g., a stop bath and a hardening bath) can be carried out. The time and conditions for the application of processings by these auxiliary baths may be selected according to an ordinary method.

The following examples are intended to illustrate the present invention more practically but not to limit it in any way within the scope of this invention.

EXAMPLE 1

Three different kinds of light-sensitive materials, i.e., a negative-working light-sensitive lithographic printing plate (hereinafter, is referred to as a negative PS plate), a positive-working light-sensitive lithographic printing plate (hereinafter, is referred to as a positive PS plate), and a developing agent-containing type silver chlorobromide photographic material (hereinafter, is referred to as an AgClBr film) were prepared, they were developed using a commercially available developer for light-sensitive lithographic printing plate (comparison developer) and developers prepared (comparison developer and the developers of this invention), and the results obtained are evaluated.

(1) Preparation of negative-working light-sensitive lithographic printing plate:

The surface of an aluminum plate having a thickness of 0.30 mm was grained using a nylon brush and an aqueous suspension of pumice of 400 mesh, etched in an aqueous sodium aluminate of 60° C. for 10 seconds, and subjected to an anodic oxidation treatment in a 20% sulfuric acid electrolyte under a current density of 2 A/dm$^2$ to form 2.7 g/m$^2$ of direct current anodized film on the surface of the aluminum plate. Thereafter, the aluminum plate was subjected to a sealing treatment in an aqueous solution of 3% sodium silicate for 1 minute at 60° C. followed by washing and drying to provide a support.

Then, the following photosensitive composition was coated on the support by means of a whirler and dried for 2 minutes at 100° C. to provide a negative-working light-sensitive lithographic printing plate. In this case, the dry weight of the coated layer was 2.0 g/m$^2$.

Photosensitive Composition

| | |
|---|---|
| Binder Resin*[1] | 10 g |
| Diazo Resin*[2] | 1.3 g |
| "Victoria Pure Blue BOH"*[3] | 0.15 g |
| Malic Acid | 0.2 g |
| "Megafac F-177"*[4] | 0.05 g |
| Methyl Cellosolve | 170 g |

*1): The binder resin had the composition shown below and the weight-average molecular weight was 70,000.

Binder Resin

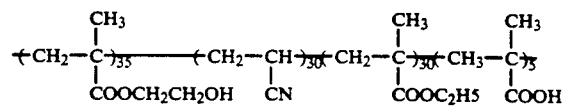

*2): The diazo resin was the hexafluorophosphate of the condensate of 4-diazodiphenylamine and paraformaldehyde.

*3): "Victoria Pure Blue BOH" was an oil-soluble dye made by Hodogaya Chemical Co., Ltd.

*4): "Megafac F-177" was a fluorine series surface active agent made by Dainippon Ink and Chemicals, Inc.

Preparation of positive-working light-sensitive lithographic printing plate:

A support was prepared by the same method as the method of preparing the support for the foregoing negative-working light-sensitive lithographic printing plate except that the treatment with an aqueous sodium silicate was not carried out and the following photosensitive composition was coated on the support by means of a whirler followed by drying for 3 minutes at 100° C. to provide a positive-working light-sensitive lithographic printing plate. The dry weight of the coated layer was 2.0 g/m².

Photosensitive Composition

| | |
|---|---|
| Ester compound*5 of naphthoquinone-1,2-diazido-5-sulfonyl chloride, pyrogallol, and acetone resin | 30 g |
| Cresol.formaldehyde resin | 75 g |
| 2-(p-Methoxystyryl)-4,6-bis(trichloromethyl)-s-triazine | 0.6 g |
| Oil Blue #603*6 | 1.5 g |
| Methyl Cellosolve Acetate | 900 g |

*5): Photosensitive agent in Example 1 of JP-A-2-1390.

*6) Made by Orient Kagaku Kogyo K. K.

(3) Preparation of developing agent-containing type silver chlorobromide photographic material:

By adding an aqueous silver nitrate solution and an aqueous solution of a mixture of potassium iodide, potassium bromide and sodium chloride (I:Br:Cl=0.1:30:70 by molar ratio) containing $7.5 \times 10^{-8}$ mol of sodium rhodium (III) hexachloride per mol of silver to an aqueous gelatin solution kept at 40° C. while keeping pAg at 7.2 over a period of 75 minutes, a cubic monodispersed silver chlorobromide emulsion having a mean grain size of 0.28 μm and containing 0.1 mol% silver iodide. After removing soluble salts by an ordinary method, $4 \times 10^{-5}$ mol of sodium thiosulfate and $1 \times 10^{-5}$ mol of chloroauric acid per mol of the silver halide were added to the emulsion and the emulsion was chemically ripened for 60 minutes at 48° C. The silver halide emulsion contained 80 g of gelatin per mol of silver halide.

After adding each of $6 \times 10^{-3}$ mol of 6-hydroxy-4-methyl-1,3,3a,7-tetraazaindene and $3.5 \times 10^{-4}$ mol of 3,3'-dimethylthiazolinocarbocyaninemethyl sulfate per mol of silver halide to the silver halide emulsion thus prepared, the emulsion was coated on a polyethylene terephthalate base having previously coated thereon a subbing layer containing hydroquinone as a developing agent at a silver coverage of 40 mg per 100 cm². The subbing layer was formed by coating an aqueous gelatin solution containing 2 wt% hydroquinone, an aqueous 1% solution of 1.5 wt% OTP-100S (trade name, made by Nikko Chemicals K. K.), and 16 wt% gelatin on the polyethylene terephthalate base followed by drying. The foregoing subbing layer and the silver halide emulsion layer were protected by a gelatin protective layer containing formaldehyde and dimethylolurea as hardening agents.

The developing agent-containing type silver chlorobromide photographic material contained 0.29 mol of hydroquinone per mol of coated silver amount.

The three different kinds of light-sensitive materials thus prepared were processed with the following developers.

Developer 1

FCT-115 (for nega.posi PS plates, trade name, made by Fuji Photo Film Co., Ltd.)

Developer 2

SD-32 (for nega posi PS plates, trade name, made by Konica Corporation) 1:5 diluted liquid.

Developer 3

Developer for nega.posi PS plates by Example 19 of JP-A-60-130741.

Developer Composition

| | |
|---|---|
| Ethylene Glycol Monobenzyl Ether | 10 g |
| Sodium Alkylnaphthalenesulfonate | 60 g |
| Sodium Hydroxide | 5 g |
| Sodium Silicate | 2.5 g |
| Sodium Tetraborate | 0.5 g |
| Water | 982 g |

Developer 4

Activator for a developing agent-containing type silver halide photographic material by development activator composition C in Example 1 of JP-B-56-30848.

Developer Composition

| | |
|---|---|
| Anhydrous Sodium Carbonate | 100 g |
| Potassium Bromide | 1 g |
| Hydroxylamine Sulfate | 10 g |
| Water to make | 1 liter |
| pH adjusted to 12 with sodium hydroxide. | |

Developer 5

Activator for a developing agent-containing type silver halide photographic material by activator $A_2$ in the example of JP-B-61-38457.

Developer Composition

| | |
|---|---|
| Anhydrous Sodium sulfite | 15 g |
| Sodium Hydroxide | 44 g |
| Potassium Bromide | 7 g |
| Ethylenediamine | 1 g |
| Water to make | 1 liter |

Developer 6

Developer of the negative PS plate illustrated as Example 1 in JP-A-1-279245.

Developer Composition

| | |
|---|---|
| 2-Benzylamino Ethanol | 3.5 g |
| "Pelex NBL"*7 | 3.0 g |
| Sodium Metasilicate | 0.5 g |
| Water | 93.0 g |

*7) Anionic surface active agent, trade name, made by Kao Atlas K. K.)

Developer 7

Developer for both the nega.posi PS plates and the developing agent-containing type silver halide photographic material illustrated as Developer 11 in Example 1 of Japanese Patent Application No. 2-306680.

Developer Composition

| | |
|---|---|
| Benzyl Alcohol | 43 g |
| Potassium Silicate | 87 g |
| "Pelex NBL"*7 | 64 g |
| 3-Diethylaminopropane-1,2-diol | 150 g |
| 5-Methylbenzotriazole | 0.4 g |
| Water | 2000 g |
| pH | 12.2 |

Developer 8

Comparison developer to the developer of the present invention.

Developer Composition

| | |
|---|---|
| Aniline | 40 g |
| Potassium Silicate | 87 g |
| "Pelex NBL"*7 | 64 g |
| 5-Methylbenzotriazole | 0.2 g |
| Water | 2000 g |
| pH | 12.1 |

Developer 9

Comparison developer to the developer of the present invention.

Developer Composition

| | |
|---|---|
| Benzylamine | 40 g |
| Potassium Silicate | 87 g |
| "Pelex NBL"*7 | 64 g |
| 5-Methylbenzotriazole | 0.2 g |
| Water | 2000 g |
| pH | 12.0 |

Developer 10

Developer of the present invention.

Developer Composition

| | |
|---|---|
| 2-Anilinoethanoethanol (Compound 1) | 40 g |
| Potassium Silicate | 87 g |
| "Pelex NBL"*7 | 64 g |
| 5-Methylbenzotriazole | 0.2 g |
| Water | 2000 g |
| pH | 12.0 |

Developer 11

Developer of the present invention.

Developer Composition

| | |
|---|---|
| 2-Benzylaminoethanol (Compound 2) | 40 g |
| Potassium Silicate | 87 g |
| "Pelex NBL"*7 | 64 g |
| 5-Methylbenzotriazole | 0.2 g |
| Water | 2000 g |
| pH | 12.0 |

Developer 12

Developer of the present invention.

Developer Composition

| | |
|---|---|
| 2-(2'-anilinoethoxy)ethanol (Compound 6) | 40 g |
| Potassium Silicate | 87 g |
| "Pelex NBL"*7 | 64 g |
| 5-Methylbenzotriazole | 0.2 g |
| Water | 2000 g |
| pH | 12.0 |

Developer 13

Developer of the present invention.

Developer Composition

| | |
|---|---|
| N-Phenyldiethanolamine (Compound 8) | 40 g |
| Potassium Silicate | 87 g |
| "Pelex NBL"*7 | 64 g |
| 5-Methylbenzotriazole | 0.2 g |
| Water | 2000 g |
| pH | 12.0 |

Developer 14

Developer of the present invention.

Developer Composition

| | |
|---|---|
| p-Tolyldiethanolamine (Compound 11) | 40 g |
| Potassium Silicate | 87 g |
| "Pelex NBL"*7 | 64 g |
| 5-Methylbenzotriazole | 0.2 g |
| Water | 2000 g |
| pH | 12.0 |

Developer 15

Developer of the present invention.

Developer Composition

| | |
|---|---|
| 2-(N-Ethylanilino)ethanol (Compound 15) | 40 g |
| Potassium Silicate | 87 g |
| "Pelex NBL"*7 | 64 g |
| 5-Methylbenzotriazole | 0.2 g |
| Water | 2000 g |
| pH | 12.0 |

Each of the three different kinds of the light-sensitive materials, i.e., the negative PS plate, the positive PS plate, and the AgClBr film prepared by the methods described above was developed by the following processing method using each same developer to provide each sample and the result was evaluated.

A photographic film having a negative image and an Ugra wedge were brought into contact with the negative PS plate and the plate was exposed to a metal halide lamp of 1 kW output ("Idolfin 1000", trade name, manufactured by Iwasaki Electric Co., Ltd.) disposed at the position of 1 meter apart from the plate for an exposure time that the light sensitivity became the step 4. Thereafter, the sample thus image-exposed was developed with each of the foregoing developer for one minute at 25° C. and washed with water while lightly rubbing the surface of the plate with a sponge followed by drying. The image quality of each sample thus obtained was evaluated in three grades of A (excellent), B (usable), and C (not acceptable) and when a corrosion was observed on the aluminum base plate, the case was evaluated as X.

A photographic film having dot positive image and an Ugra wedge were brought into contact with the positive PS plate and the plate was exposed of a metal halide lamp of 1 kW output ("Idolfin 1000", trade name, manufactured by Iwasaki Electric Co., Ltd.) disposed at the position of 1 meter apart from the plate for an exposure time that the light-sensitivity became 4 step clear. Thereafter, the sample was developed with each of the developers for one minute at 25° C. and washed with water while lightly rubbing the surface of the plate with a sponge followed by drying. The image quality of each sample thus obtained was evaluated in three grades of A (excellent), B (usable), and C (not acceptable). When a corrosion was observed on the aluminum base plate, the case was evaluated as X.

After exposing the AgClBr film with a tungsten light source of 2666K using an LB-200 filter through a step wedge having step difference of 0.15 for 5 seconds, the film was developed with each of the developers for 30 seconds at 38° C., stopped, fixed, washed and dried to provide each sample. Also, after exposing the AgClBr film using a tungsten light source of 100 volts, 500 watts through a gray contact screen having 133 lines per inch for 3 seconds, the film was developed with each of the developers for 30 seconds at 38° C., stopped, fixed, washed, and dried to provide each sample. The two kinds of the samples thus obtained were evaluated and the results were shown in three grades, i.e., A: the sample having a good negative image, B: the sample having a negative image of a quality of barely practically usable, and C: the sample practically unusable.

The results obtained are shown in Table 1 below.

TABLE 1

| Developer No. | Negative PS Plate | Positive PS Plate | AgClBr Film |
|---|---|---|---|
| 1 | CX | A | C |
| 2 | C | A | C |
| 3 | B | A | C |
| 4 | C | C | B |
| 5 | CX | CX | B |
| 6 | A | C | C |
| 7 | A | A | A |
| 8 | A | A | C |
| 9 | A | A | C |
| 10 | A | A | A |
| 11 | A | A | A |
| 12 | A | A | A |
| 13 | A | A | A |
| 14 | A | A | A |
| 15 | A | A | A |

Developer Nos. 1 to 9: Comparison developers
Developer Nos. 10 to 15: Developers of the invention As is clear from the results shown in Table 1, it can be seen that the developers of this invention (Developer Nos. 10, 11, 12, 13, 14, and 15) do not give problems for handling, such as the generation of bad smell and can develop very well each of the negative PS plate, the positive PS plate, and the AgClBr film. However, on the other hand, the commercially available developers for nega posi PS plates (Developer Nos. 1, 2, and 3) can not develop well all the three kinds of the light-sensitive materials, i.e., the negative PS plate, the positive PS plate and the AgClBr film prepared in the example. Also, the activators (developer Nos. 4 and 5) for a developing agent-containing silver halide photographic material can develop the AgClBr film but can not develop the negative and positive PS plates. Developer No. 6 (a comparison developer based on JP-A-1-279245) can develop well the negative PS plate but can not develop the positive PS plate and the AgClBr film.

Also, when a compound of formula (I) wherein two hydrogen atoms are bonded to the nitrogen atom, that is, a primary amine compound is used as the main component for developer as developer Nos. 8 and 9 (the comparison developers to the developer of the present invention), in the development of the AgClBr film, the formation of fog is high and negative images practically usable can not be obtained.

Developer No. 7 (the comparison developer based on Japanese Patent Application No. 2-306680) can develop well all the negative PS plate, the positive PS plate, and the AgClBr film but a bad smell by the amine compound used is strong and thus there is a problem on handling.

EXAMPLE 2

Using three kinds of light-sensitive materials, that is, using commercially available FNS (trade name, made by Fuji Photo Film Co., Ltd.), FNT-5 (trade name, made by Fuji Photo Film Co., Ltd.), SWN-X (trade name, made by Konica Corporation), and RN (trade name, made by Polychrome Japan K. K.) as negative PS plates; commercially available FPD (trade name, made by Fuji Photo Film Co., Ltd.), ST-0117 (trade name, made by Konica Corporation), and LP (trade name, made by Polychrome Japan K.K.) as positive PS plates; and the AgClBr film prepared in Example 1 above as an AgClBr film, the same procedure as in Example 1 was followed using developer Nos. 1, 2, 10, 11, 12, 13, 14, and 15 in Example 1 to provide each sample being evaluated.

The evaluation results of these samples are shown in Table 2 (nega posi PS plates) and Table 3 (AgClBr film). The evaluation standard in Table 2 is same as in Example 1. As to the terms of the photographic performance shown in Table 3, Dmax is the maximum blackened density of the developed film, B +F is fog, G is a mean slope between the blackened densities 0.5 and 3.0 excluding fog, and Toe G is a mean slope between the blackened densities 0.1 and 0.5 excluding fog. Also, as to the evaluation of the dot quality, the dots are observed by a microscope, the quality that the dot fringe is small and dot is sharp is defined as A, the quality having too much fringes is defined as C, and an intermediate quality between them is defined as B. Practically, A is excellent, B is usable, and C is not acceptable.

TABLE 2

| | (Results of nega.posi PS plates) | | | | | | |
|---|---|---|---|---|---|---|---|
| | Negative PS Plate | | | | Positive PS Plate | | |
| Developer | FNS | FNT-5 | SWN-X | RN | FPD | ST-0117 | LP |
| 1 | B | A | C | C | A | B | A |
| 2 | C | C | A | C | A | A | A |
| 10 | A | B | B | A | A | A | A |
| 11 | A | B | A | A | A | A | A |
| 12 | A | A | B | A | A | A | A |
| 13 | A | B | B | A | A | A | A |
| 14 | A | A | A | A | A | A | A |

TABLE 2-continued

| | (Results of nega.posi PS plates) | | | | | | |
|---|---|---|---|---|---|---|---|
| | Negative PS Plate | | | | Positive PS Plate | | |
| Developer | FNS | FNT-5 | SWN-X | RN | FPD | ST-0117 | LP |
| 15 | A | A | B | A | A | A | A |

From the results shown in Table 2, it can be seen that the developers of this invention (developer Nos. 10 to 15) have high common usability for commercially available nega.posi PS plates as compared to the comparison developers (developer Nos. 1 and 2) and can develop well the PS plates made by various companies.

TABLE 3

| | (Result of AgClBr Film) | | | | |
|---|---|---|---|---|---|
| Developer | Photographic Performance | | | | |
| No. | Dmax | B + F | G | Toe G | Dot Image |
| 1 | 5.1 | 1.36 | 5.1 | 3.3 | C |
| 2 | 4.2 | 0.04 | 4.0 | 1.6 | C |
| 10 | 4.7 | 0.04 | 12.1 | 6.7 | A |
| 11 | 4.5 | 0.05 | 17.3 | 10.3 | A |
| 12 | 4.3 | 0.04 | 14.6 | 5.9 | A |
| 13 | 4.4 | 0.04 | 13.4 | 6.1 | A |
| 14 | 4.5 | 0.05 | 11.7 | 4.7 | A |
| 15 | 4.6 | 0.04 | 11.5 | 4.5 | A |

As is clear from the results shown in Table 3, each of the developers of this invention (developer Nos. 10 to 15 gives negative images having a high contrast and a good dot quality. On the other hand, the negative images obtained using comparison developers (developer Nos. 1 and 2) have bad dot quality, which can not be practically used.

As described above, according to the developers of the present invention, all the negative PS plate, the positive PS plate and the AgClBr film can be developed well.

EXAMPLE 3

After developing each of the negative PS plate and the positive PS plate as prepared in Example 1 using each of developer Nos. 10, 11, and 14 of the present invention and developer No. 7 as a comparison developer, each plate was washed with water, coated with an aqueous solution of gum arabic 7° Be', and puff-dried to provide each lithographic printing plate. As to the negative and positive lithographic printing plates, the ink roll-up property, the printing impression, and the plate scumming were evaluated and the results obtained are shown in Table 4. The test methods were as follows.

Printing was carried out using a printing ink, GRAF-G Scarlet (trade name, made by Dainippon Ink and Chemicals, Inc.) and fountain water, DH-78 (trade name, made by Dainippon Ink and Chemicals, Inc.) diluted to 400 times. The ink roll-up property was evaluated by the number of prints at the initiation of printing until a print having a proper ink density was obtained, and the less the printed number is, the better the sensitivity is. The evaluation was made by A (less than 10 prints), B (from 10 to 20 prints), and C (more than 20 prints).

The printing impression was evaluated by whether or not a good reproducibility of the original was obtained without causing dot gain and plate wearing at printing 30,000 prints and 50,000 prints. Evaluation was made by three grades of A (excellent), B (usable), and C (not acceptable).

The plate scumming was evaluated by susceptibility of scumming at the none imaged area when the amount of fountain water was reduced to a half of the appropriate amount. The evaluation was made by three grades of A (good), B (usable), and C (scummed).

TABLE 4

| Developer No. | Printing Plate | (A) | (B) | Printing 30,000 | Impression 50,000 |
|---|---|---|---|---|---|
| 7 | Negative | A | A | A | B |
| 7 | Positive | A | A | A | B |
| 10 | Negative | A | A | A | A |
| 10 | Positive | A | A | A | A |
| 11 | Negative | A | A | A | A |
| 11 | Positive | A | A | A | A |
| 14 | Negative | A | A | A | A |
| 14 | Positive | A | A | A | A |

(A) Ink roll-up property
(B) Printing scumming

From the results shown in Table 4, it can be seen that the negative and positive printing plates obtained by developing using the developers of the present invention can print well 50,000 prints without causing any wearness, while in the case of using developer No. 7 (the comparison developer by Japanese Patent Application No. 2-306680), the printing impression was 30,000 prints.

While the invention has been described in detail and with reference to specific embodiments thereof, it will be apparent to one skilled in the art that various changes and modifications can be made therein without departing from the spirit and scope thereof.

What is claimed is:

1. A developer for light-sensitive lithographic printing plates and developing agent-containing silver halide photographic materials, which comprises an alkali agent, an anionic surface active agent, an antifoggant for a silver halide photographic material, and an alkylene oxide addition product having a molecular weight of from 130 to 1200 of an aromatic amine or an aralkyl amine, said developer having a pH in the range of from 11.5 to 13.5.

2. The developer for light-sensitive material of claim 1, wherein the alkylene oxide addition product of aromatic amine is an ethylene oxide or propylene oxide addition product of phenyl amine.

3. The developer for light-sensitive material of claim 1, wherein the alkylene oxide addition product of an aralkyl amine is an ethylene oxide or propylene oxide addition product of benzyl amine.

4. The developer for light-sensitive material of claim 1, wherein said alkylene oxide addition product of an aromatic amine or an aralkyl amine is represented by formula (I'):

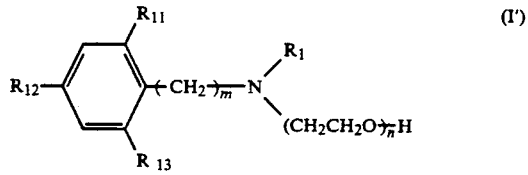

wherein $R_{11}$, $R_{12}$ and $R_{13}$ each represents a hydrogen atom, a halogen atom, an alkyl group, a dialkylamino group, or an alkoxy group; $R_1$ represents a hydrogen atom, an alkyl group, or $-(CH_2CH_2O)_l-H$; m represents 0 or an integer of from 1 to 4; and l and n each represents an integer of from 1 to 4.

5. A developer for light-sensitive material comprising an alkali agent, an anionic surface active agent, an antifoggant for a silver halide photographic material, and an amino compound represented by formula (I), and having pH in the range of from 11.5 to 13.5:

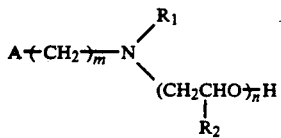

wherein A represents an aromatic group which may be substituted; $R_1$ represents a hydrogen atom, an alkyl group, or $$-(CH_2CHO)_l-OH;$$
$$\phantom{-(CH_2CHO)_l-}|$$
$$\phantom{-(CH_2CHO)_l-}R_3$$

$R_2$ and $R_3$ each represents a hydrogen atom or a methyl group; m represents 0 or an integer of from 1 to 4; and l and n each represents an integer of from 1 to 4.

6. The developer for light-sensitive material of claim 5, wherein the alkali agent is a silicate.

7. The developer for light-sensitive material of claim 5, wherein the anionic surface active agent is a higher alcohol sulfuric acid ester salt.

8. The developer for light-sensitive material of claim 5, wherein the anionic surface active agent is a higher alcohol phosphoric acid ester salt.

9. The developer for light-sensitive material of claim 5, wherein the antifoggant for a silver halide photographic material is an organic compound having a sulfur atom or a nitrogen atom.

* * * * *